United States Patent
Lee et al.

(10) Patent No.: US 8,471,311 B2
(45) Date of Patent: Jun. 25, 2013

(54) ANTI-REFLECTIVE IMAGE SENSOR

(75) Inventors: Jeong-Ho Lee, Seoul (KR); Sang-Il Jung, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 229 days.

(21) Appl. No.: 12/836,108

(22) Filed: Jul. 14, 2010

(65) Prior Publication Data
US 2011/0057279 A1     Mar. 10, 2011

(30) Foreign Application Priority Data

Sep. 9, 2009   (KR) .................. 10-2009-0084719

(51) Int. Cl.
*H01L 31/062*    (2012.01)
*H01L 31/113*    (2006.01)

(52) U.S. Cl.
USPC ........... 257/291; 257/292; 257/432; 257/436; 257/437; 257/E31.121

(58) Field of Classification Search
USPC ........... 257/291, 292, 432, 436, 437, E31.121
See application file for complete search history.

(56) References Cited

U.S. PATENT DOCUMENTS

| | | |
|---|---|---|
| 7,493,713 B2 | 2/2009 | Park |
| 2008/0079106 A1* | 4/2008 | Miyagawa et al. ........... 257/437 |
| 2008/0150056 A1* | 6/2008 | Kim ............................... 257/432 |
| 2010/0006969 A1* | 1/2010 | Park et al. ...................... 257/446 |
| 2010/0078744 A1* | 4/2010 | Wano et al. .................... 257/432 |
| 2011/0025872 A1* | 2/2011 | Oshiyama et al. .......... 348/222.1 |
| 2011/0108705 A1* | 5/2011 | Izuha et al. ................ 250/208.1 |
| 2011/0175187 A1* | 7/2011 | Ueno et al. .................... 257/437 |
| 2011/0198486 A1* | 8/2011 | Lee ........................... 250/227.31 |
| 2011/0198716 A1* | 8/2011 | Lee ............................... 257/432 |
| 2011/0201144 A1* | 8/2011 | Toda ................................ 438/69 |
| 2011/0242350 A1* | 10/2011 | Sawayama ................. 348/222.1 |
| 2011/0242376 A1* | 10/2011 | Ando ............................. 348/294 |
| 2011/0269259 A1* | 11/2011 | Tatani et al. .................... 438/73 |
| 2011/0278688 A1* | 11/2011 | Rennie ........................... 257/432 |

* cited by examiner

*Primary Examiner* — Ngan Ngo
(74) *Attorney, Agent, or Firm* — F. Chau & Associates, LLC

(57) ABSTRACT

An anti-reflective image sensor and method of fabrication are provided, the sensor including a substrate; first color sensing pixels disposed in the substrate; second color sensing pixels disposed in the substrate; third color sensing pixels disposed in the substrate; a first layer disposed directly on the first, second and third color sensing pixels; a second layer disposed directly on the first layer overlying the first, second and third color sensing pixels; and a third layer disposed directly on portions of the second layer overlying at least one of the first or second color sensing pixels, wherein the first layer has a first refractive index, the second layer has a second refractive index greater than the first refractive index, and the third layer has a third refractive index greater than the second refractive index.

25 Claims, 10 Drawing Sheets

ANTI-REFLECTIVE IMAGE SENSOR

CROSS-REFERENCE TO RELATED APPLICATION

This application claims foreign priority under 35 U.S.C. §119 to Korean Patent Application No. P2009-0084719, filed on Sep. 9, 2009, in the Korean Intellectual Property Office, the disclosure of which is incorporated by reference herein in its entirety.

BACKGROUND

The present disclosure generally relates to image sensors, and more particularly relates to image sensors having anti-reflection layers.

SUMMARY

The present disclosure teaches an image sensor having an anti-reflection layer, and a fabrication method thereof. Exemplary embodiments are provided.

An exemplary embodiment anti-reflective image sensor is provided, comprising: a substrate; a plurality of first color sensing pixels disposed in the substrate; a plurality of second color sensing pixels disposed in the substrate; a plurality of third color sensing pixels disposed in the substrate; a first layer disposed directly on the pluralities of first, second and third color sensing pixels; a second layer disposed directly on the first layer overlying the pluralities of first, second and third color sensing pixels; and a third layer disposed directly on portions of the second layer overlying at least one of the pluralities of first or second color sensing pixels, wherein the first layer has a first refractive index, the second layer has a second refractive index greater than the first refractive index, and the third layer has a third refractive index greater than the second refractive index.

Another exemplary embodiment anti-reflective image sensor is provided wherein the first color is red, the second color is green, and the third color is blue. Another exemplary embodiment anti-reflective image sensor is provided wherein the first color is magenta, the second color is yellow, and the third color is cyan. Another exemplary embodiment anti-reflective image sensor is provided wherein the first layer comprises $SiO_2$, the second layer comprises $Si_3N_4$, and the third layer comprises $TiO_2$ or heat-treated SiON. Another exemplary embodiment anti-reflective image sensor is provided wherein the first layer has a refractive index between about 1.45 and about 1.50, and the second layer has a refractive index between about 1.95 and about 2.05. Another exemplary embodiment anti-reflective image sensor is provided wherein the first layer has a thickness of about 15 nm, the second layer has a thickness of about 7 nm, and the third layer has a thickness of about 15 nm. Another exemplary embodiment anti-reflective image sensor is provided wherein the first layer is a gate dielectric layer or an insulating layer.

Still another exemplary embodiment anti-reflective image sensor is provided, further comprising a fourth layer disposed on the exposed second and third layers, comprising the same material as the second layer. Another exemplary embodiment anti-reflective image sensor is provided, further comprising: a first inter-layer dielectric region disposed on the second and third layers in a sensor array region; and a second inter-layer dielectric region disposed in a peripheral circuit region, wherein a top of the first inter-layer dielectric region is lower than a top of the second inter-layer dielectric region. Another exemplary embodiment anti-reflective image sensor is provided, further comprising: a first inter-layer dielectric region disposed under the first layer in a sensor array region; and at least one micro-lens disposed above the first layer for backside illumination.

Another exemplary embodiment anti-reflective image sensor is provided wherein the third layer is disposed on all of the first or second color pixels, and disposed on some of the second or first color pixels, respectively.

Yet another exemplary embodiment anti-reflective image sensor is provided, comprising: a substrate; a first color sensing pixel disposed in the substrate; a first layer disposed directly on the first color sensing pixel; a second layer disposed directly on the first layer overlying the first color sensing pixel; and a third layer disposed directly on the second layer overlying the first color sensing pixel, wherein the first layer comprises a Silicon Oxide compound, the second layer comprises a Silicon Nitride compound, and the third layer comprises a heat-treated Silicon Oxy-Nitride compound.

Still another exemplary embodiment anti-reflective image sensor is provided wherein the first color is red. Another exemplary embodiment anti-reflective image sensor is provided wherein the first layer is $SiO_2$, the second layer is SiN, and the third layer is heat-treated SiON.

Another exemplary embodiment anti-reflective image sensor is provided, further comprising: a second color sensing pixel disposed in the substrate; a third color sensing pixel disposed in the substrate; a first layer disposed directly on the first, second and third color sensing pixels; a second layer disposed directly on the first layer overlying the first, second and third color sensing pixels; and a third layer disposed directly on portions of the second layer overlying at least one of the first or second color sensing pixels, wherein the first layer has a first refractive index, the second layer has a second refractive index greater than the first refractive index, and the third layer has a third refractive index greater than the second refractive index.

Still another exemplary embodiment anti-reflective image sensor is provided wherein the first color is red, the second color is green, and the third color is blue. Another exemplary embodiment anti-reflective image sensor is provided wherein the first color is magenta, the second color is yellow, and the third color is cyan. Another exemplary embodiment anti-reflective image sensor is provided wherein the first layer comprises $SiO_2$, the second layer comprises $Si_3N_4$, and the third layer comprises heat-treated SiON. Another exemplary embodiment anti-reflective image sensor is provided wherein the first layer has a refractive index between about 1.45 and about 1.50, and the second layer has a refractive index between about 1.95 and about 2.05. Another exemplary embodiment anti-reflective image sensor is provided wherein the first layer has a thickness of about 15 nm, the second layer has a thickness of about 7 nm, and the third layer has a thickness of about 15 nm. Another exemplary embodiment anti-reflective image sensor is provided wherein the first layer is a gate dielectric layer or an insulating layer.

Yet another exemplary embodiment anti-reflective image sensor is provided, further comprising a fourth layer disposed on the exposed second and third layers, comprising the same material as the second layer. Another exemplary embodiment anti-reflective image sensor is provided, further comprising: a first inter-layer dielectric region disposed on the second and third layers in a sensor array region; and a second inter-layer dielectric region disposed in a peripheral circuit region, wherein a top of the first inter-layer dielectric region is lower than a top of the second inter-layer dielectric region.

Another exemplary embodiment anti-reflective image sensor is provided, further comprising: a first inter-layer dielectric region disposed under the first layer in a sensor array region; and at least one micro-lens disposed above the first layer for backside illumination. Another exemplary embodiment anti-reflective image sensor is provided wherein the third layer is disposed on all of the first or second color pixels, and disposed on some of the second or first color pixels, respectively.

An exemplary embodiment method of forming an anti-reflective image sensor is provided, comprising: forming pluralities of first, second and third color sensing pixels in a substrate, respectively; depositing a first layer disposed directly on the pluralities of first, second and third color sensing pixels; depositing a second layer disposed directly on the first layer overlying the pluralities of first, second and third color sensing pixels; and depositing a third layer disposed directly on portions of the second layer overlying at least one of the pluralities of first or second color sensing pixels, wherein the first layer has a first refractive index, the second layer has a second refractive index greater than the first refractive index, and the third layer has a third refractive index greater than the second refractive index.

Another exemplary embodiment method of forming an anti-reflective image sensor is provided wherein the first color is red, the second color is green, and the third color is blue. Another exemplary embodiment method of forming an anti-reflective image sensor is provided wherein the first color is magenta, the second color is yellow, and the third color is cyan.

Still another exemplary embodiment method of forming an anti-reflective image sensor is provided wherein the first layer comprises SiO2, the second layer comprises Si3N4, and the third layer comprises TiO2 or heat-treated SiON. Another exemplary embodiment method of forming an anti-reflective image sensor is provided wherein the first layer has a refractive index between about 1.45 and about 1.50, and the second layer has a refractive index between about 1.95 and about 2.05. Another exemplary embodiment method of forming an anti-reflective image sensor is provided wherein the first layer has a thickness of about 15 nm, the second layer has a thickness of about 7 nm, and the third layer has a thickness of about 15 nm. Another exemplary embodiment method of forming an anti-reflective image sensor is provided wherein the first layer is a gate dielectric layer or an insulating layer.

Another exemplary embodiment method of forming an anti-reflective image sensor is provided, further comprising forming a fourth layer on the exposed second and third layers, the fourth layer comprising the same material as the second layer. Another exemplary embodiment method of forming an anti-reflective image sensor is provided, further comprising: forming a first inter-layer dielectric region on the second and third layers in a sensor array region; and forming a second inter-layer dielectric region in a peripheral circuit region, wherein a top of the first inter-layer dielectric region is lower than a top of the second inter-layer dielectric region.

Yet another exemplary embodiment method of forming an anti-reflective image sensor is provided, further comprising: forming a first inter-layer dielectric region under the first layer in a sensor array region; and forming at least one micro-lens above the second and third layers for backside illumination. Another exemplary embodiment method of forming an anti-reflective image sensor is provided wherein the third layer is disposed on all of the first or second color sensing pixels, and disposed on some of the second or first color sensing pixels, respectively. Another exemplary embodiment method of forming an anti-reflective image sensor is provided wherein the first layer comprises a Silicon Oxide compound, the second layer comprises a Silicon Nitride compound, and the third layer comprises a heat-treated Silicon Oxy-Nitride compound.

The present disclosure may be further understood from the following description of exemplary embodiments, which is to be read in connection with the accompanying drawings.

BRIEF DESCRIPTION OF THE DRAWINGS

The present disclosure provides an image sensor having an anti-reflection layer and a related fabrication method in accordance with the following drawings, where like reference numerals may indicate like elements in the several figures, in which.

DETAILED DESCRIPTION OF PREFERRED EMBODIMENTS

Preferred embodiment image sensors and related fabrication methods thereof provide for extraordinary light sensitivity using an anti-reflection layer structure. Exemplary embodiments are provided.

Figure 1:
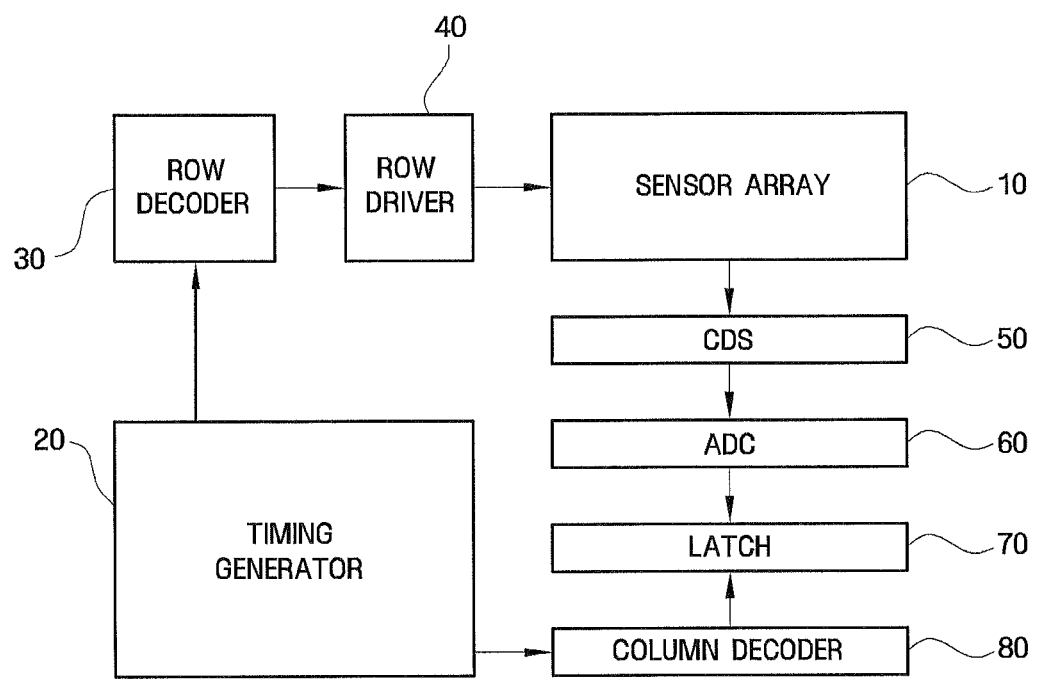
FIG. 1 is a schematic block diagram of a complementary metal oxide semiconductor (CMOS) image sensor in accordance with an exemplary embodiment of the present disclosure.

As shown in FIG. 1, a complementary metal oxide semiconductor (CMOS) image sensor according to the present disclosure includes a sensor array 10, a timing generator 20, a row decoder 30 in signal communication with the timing generator, a row driver 40 in signal communication between the row decoder and the sensor array, a correlated double sampler CDS 50 in signal communication with the sensor array, an analog-to-digital converter ADC 60 in signal communication with the correlated double sampler, a latch 70 in signal communication with the analog-to-digital converter, and a column decoder 80 in signal communication between the timing generator and the latch.

Figure 2:
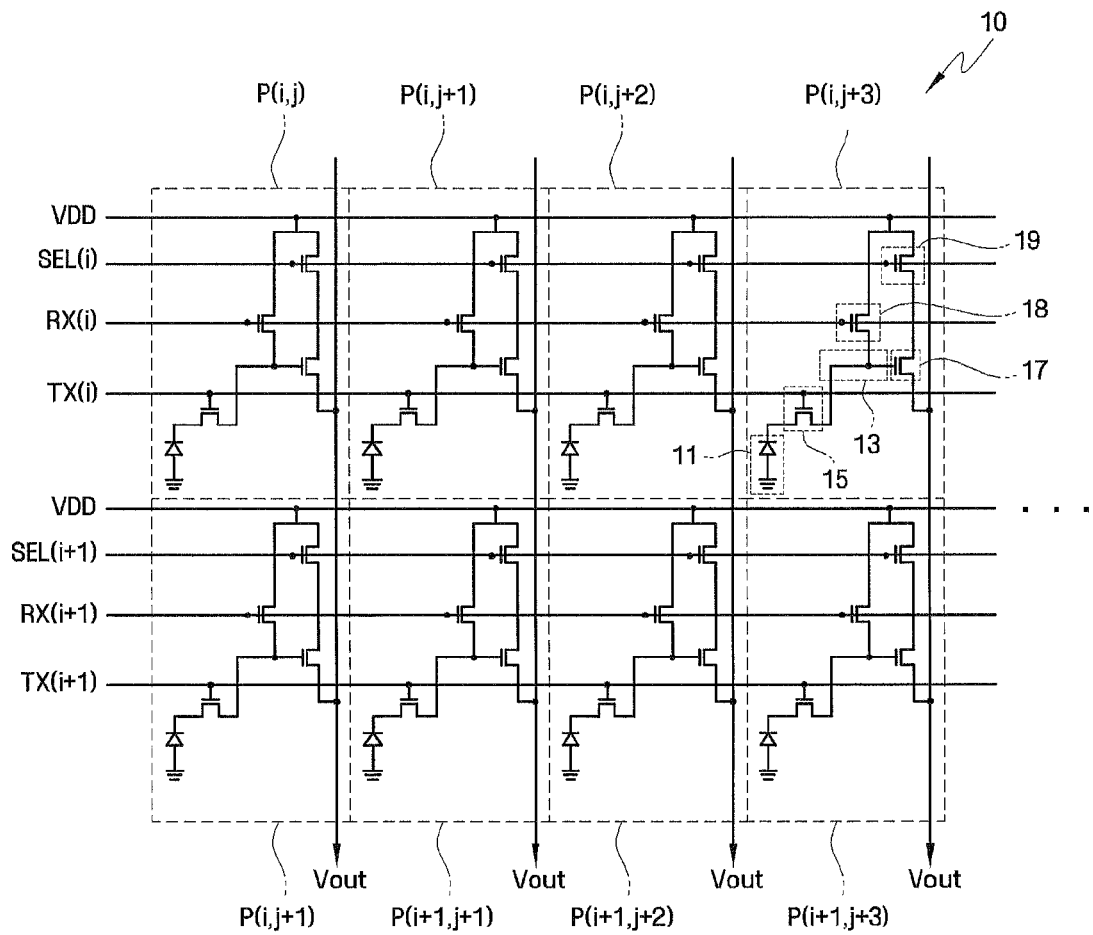
FIG. 2 is an equivalent circuit diagram of a sensor array of FIG. 1 in accordance with an exemplary embodiment of the present disclosure.

Turning to FIG. 2, an equivalent circuit for the sensor array of FIG. 1 is indicated generally by the reference numeral 10. Here, each pixel P includes a photoelectric conversion device 11, a floating diffusion region 13, a charge transfer device 15 in signal communication between the photoelectric conversion device and the floating diffusion region, a drive device 17 in signal communication with the floating diffusion region, a reset device 18 in signal communication with the floating diffusion region, and a selection device 19 in signal communication the drive device and the reset device. The photoelectric conversion device 11 includes a photodiode, a phototransistor, a photo gate, and a pinned photodiode.

In operation, the photoelectric conversion device 11 absorbs incident light and accumulates a charge corresponding to the intensity of the absorbed light. The floating diffusion region 13 converts the charge transferred from the photodiode to a voltage.

In the CMOS image sensor and sensor array of FIGS. 1 and 2, respectively, the sensor array 10 includes a plurality of unit pixels arranged in two dimensions, and the photoelectric conversion device that converts an optical image into an electrical output signal. The sensor array 10 operates by receiving a plurality of driving signals including a row selection signal, a reset signal, a charge transfer signal, and the like, from the row driver 40, and provides the electrical output signal to the correlated double sampler 50.

The timing generator 20 provides a timing signal and a control signal to the row decoder 30 and the column decoder 80. The row driver 40 provides the plurality of the driving signals for driving the plurality of unit pixels in accordance with the result decoded from the row decoder 30 to the sensor array 10.

The correlated double sampler 50 holds and samples the electrical output signal received from the sensor array 10. The analog-to-digital converter 60 converts the analog signal from the correlated double sampler into a digital signal. The latch 70 latches the digital signal, and the latched signal is sequentially output in an image signal handling part according to the result decoded from the column decoder 80.

The drive device 17 amplifies an electrical potential change of the floating diffusion region 13, and outputs it to an output line Vout. The reset device 18 resets the floating diffusion region 13 periodically by a bias voltage, such as a reset signal, provided from a reset line RXi.

The selection device 19 selects a pixel P from a row unit. When the selection device 19 is turned on by a bias voltage, such as a row selection signal provided from a row selection line SELi, an electric potential, such as a supply voltage Vdd of a drain region of the selection device 19 is transferred to a drain region of the drive device 17.

The transfer line TXi, the reset line RXi, and the row selection line SELi are arranged substantially parallel with each other extending in a row direction. Here, the transfer line TXi applies a bias to the charge transfer device 15, the reset line RXi applies a bias to the reset device 18, and the row selection line SELi applies a bias to the selection device 19.

Figure 3:
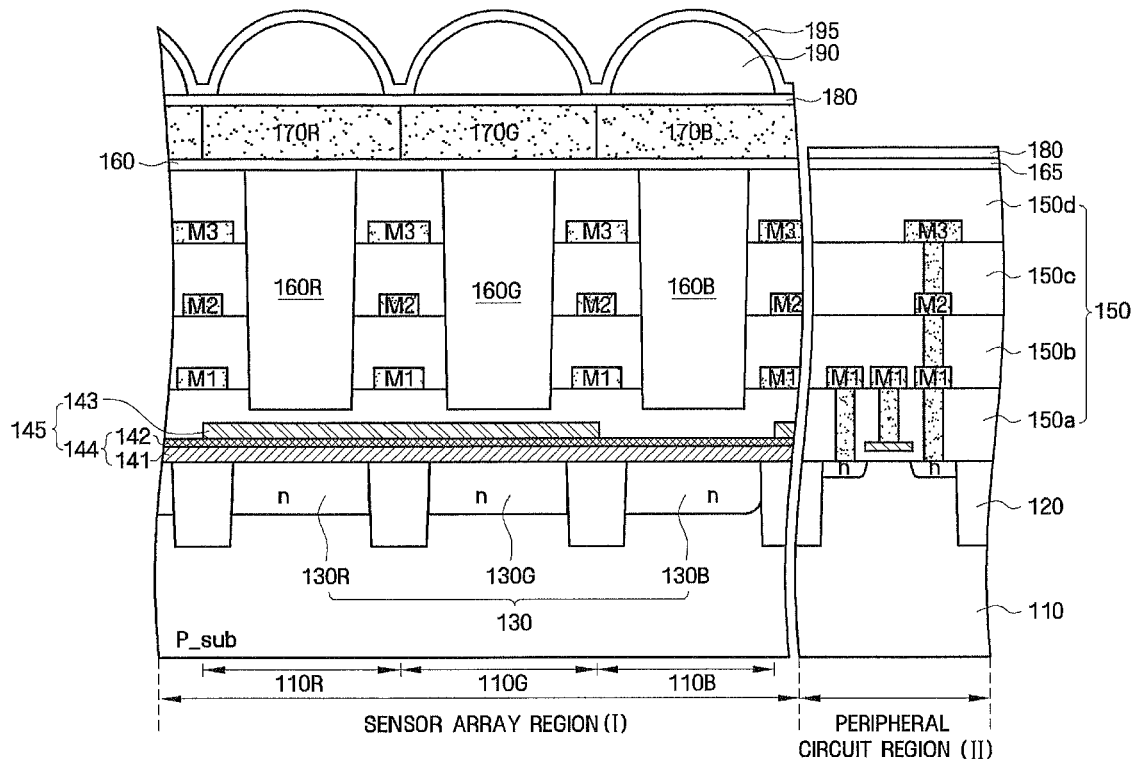
FIG. 3 is a schematic structural diagram of a first exemplary embodiment sensor device in accordance with an exemplary embodiment of the present disclosure.

Turning now to FIG. 3, a first embodiment image sensor device is shown. In this structure, the sensor array 10 of FIG. 2 is formed in the sensor array region I. The timing generator 20, the row decoder 30, the row driver 40, the CDS 50, the ADC 60, the latch 70, and the column decoder 80, all of FIG. 1, are formed in the peripheral circuit region II.

The sensor array region I includes appropriate formations. These formations include the photoelectric conversion device 130, the floating diffusion region, and a plurality of MOS devices, such as the charge transfer device, the selection device, the drive device, the reset device, and the like.

A first photoelectric conversion device 130R is formed in a first unit pixel 110R corresponding to a red color filter 170R. A second photoelectric conversion device 130G is formed in a second unit pixel 110G corresponding to a green color filter 170G; and a third photoelectric conversion device 130B is formed in a third unit pixel 110B corresponding to a blue color filter 170B.

The photoelectric conversion device 130 includes a red photodiode 130R, a green photodiode 130G, and a blue photodiode 130B. Here, the red photodiode 130R is disposed for receiving red light through the red color filter 170R, the green photodiode 130G is disposed for receiving green light through the green color filter 170G, and the blue photodiode 130B is disposed for receiving blue light through the blue color filter 170B.

An anti-reflection layer structure 144 and 145 is formed in the sensor array region I on the substrate 110. The anti-reflection layer structure substantially prevents reflection of light entering the photodiode, thereby increasing the light transmission rate in accordance with the wavelength.

The anti-reflection layer structure includes a first anti-reflection layer structure 144 having a first insulating layer 141 and a second insulating layer 142 sequentially stacked on the photodiodes 130R, 130G, and 130B. The anti-reflection layer structure further includes a second anti-reflection layer structure 145 having including the first insulating layer 141, the second insulating layer 142, and a third insulating layer 143, which is stacked on some of the photodiodes. For example, the second anti-reflection layer structure may be stacked on 130R and 130G, where the refractive indices have the relationship of 143>142>141.

The first insulating layer 141 is formed directly on the substrate 110 covering each unit pixel 110R, 110G, and 110B, and includes $SiO_2$ having a refractive index of about 1.45 to about 1.50. The first insulating layer 141 may be a gate dielectric layer, or an insulating layer formed by an additional step.

The second insulating layer 142 is formed on each unit pixel 110R, 110G, and 110B, covering the first insulating layer 141, and includes Si3N4 having a refractive index of about 1.95 to about 2.05. The third insulating layer 143 is formed on the second insulating layer 142 covering the photodiodes of 130R and 130G, but not 130B. The third insulating layer 143 includes SiON or TiO2, and has a refractive index greater than the second insulating layer 142. Here, the TiO2 has a refractive index greater than that of the SiN. Generally, the refractive index of SiON is less than that of SiN, but the SiON heat-treated in accordance with the present disclosure has a refractive index greater than that of the SiN.

For example, the first anti-reflection layer structure 144 may include the first insulating layer 141 of SiO2 having a thickness of 15 nm, and the second insulating layer 142 of SiN having a thickness of 7 nm. This first anti-reflection layer structure transmits short wavelength light or Blue light of about 400 to about 500 nm by Snell's law.

The second anti-reflection layer structure 145 may include the first insulating layer 141 of SiO2 having a thickness of 15 nm, the second insulating layer 142 of SiN having a thickness of 7 nm, and the third insulating layer 143 of heat-treated SiON having a thickness of 15 nm. This second anti-reflection layer structure transmits long wavelength light or Red/Green light of about 500 to about 700 nm by Snell's law.

The third insulting layer 143 may be selectively formed on only 130R and/or only 130G. Moreover, the third insulting layer might be on all of the red but only on some portion of the green, for example.

An inter-layer dielectric layer structure 150 is formed on the anti-reflection layer structure 144 and 145. The inter-layer dielectric layer structure includes a first interlayer dielectric layer 150a, a first interconnection layer M1, a second interlayer dielectric layer 150b, a second interconnection layer M2, a third interlayer dielectric layer 150c, a third interconnection layer M3, and a fourth interlayer dielectric layer 150d.

To increase light sensitivity of the CMOS Image Sensor (CIS), light transmission parts 160R, 160G, and 160B are formed corresponding to each photodiode 130R, 130G, and 130B, respectively, by forming a cavity between the interconnection layers M1, M2, and M3 in the interlayer dielectric layer structure 150, and filling the cavity with a light transmission material such as an organic polymer compound. For example, Cytop™, PMMA polymer, a polysiloxane resin or the polysiloxane resin-TiO compound may be used to fill the cavity.

To form the cavity, the first interlayer dielectric layer 150a may be partially or fully removed, or may alternatively not be removed. Preferably, a distance between the anti-reflection layer structure 144 and 145 and the bottom region of the light transmission parts 160R, 160G, and 160B may be about 0.08 um to about 0.11 um.

On the interlayer dielectric layer structure 150, a bottom planarization layer 165, the color filters 170R, 170G, and 170B, an upper planarization layer 180, a lens 190, and a protection layer 195 are sequentially formed. A passivation layer, such as SiN, may be formed between the fourth interlayer dielectric layer 150d and the bottom planarization layer 165 in the peripheral circuit region II, and may extend toward a destination between the fourth interlayer dielectric layer 150d and the bottom planarization 165 in the sensor array region I.

A pad pattern may be formed to connect the third interconnection layer M3 through the upper planarization layer 180, the bottom planarization layer 165, the passivation layer, and the fourth interlayer dielectric layer 150d in the peripheral circuit region II.

Figure 4:
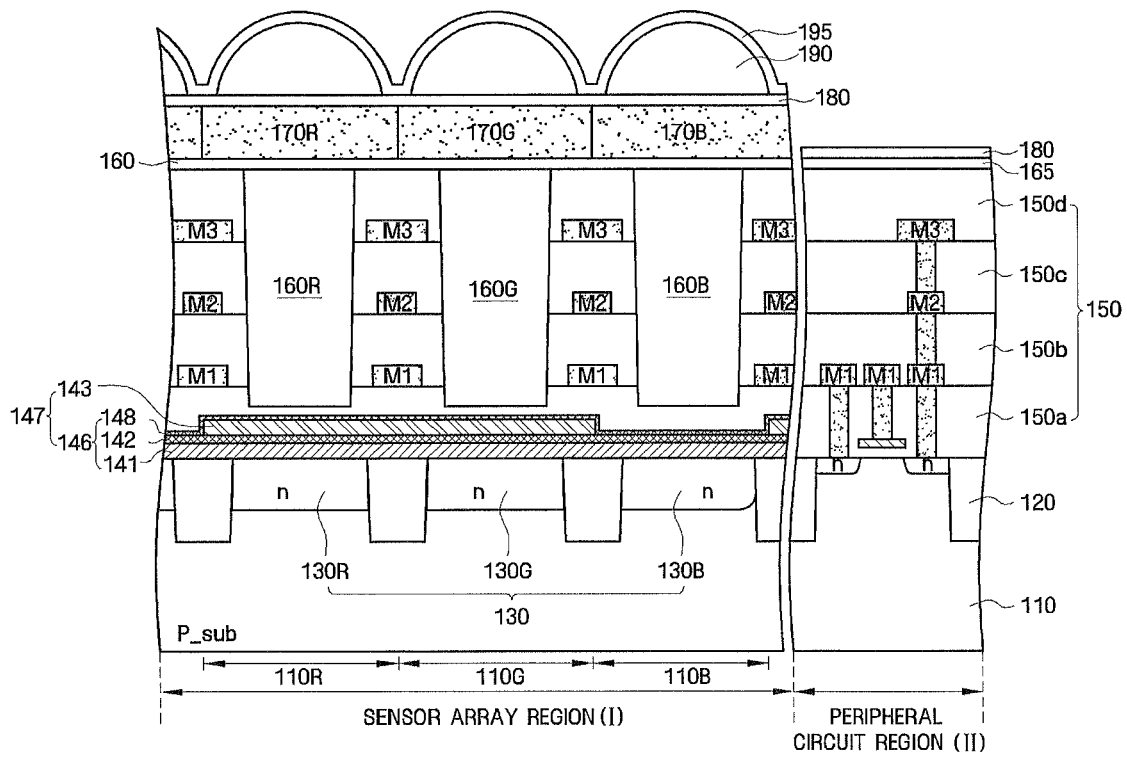
FIG. 4 is a schematic structural diagram of a second exemplary embodiment sensor device in accordance with an exemplary embodiment of the present disclosure.

As shown in FIG. 4, a second embodiment image sensor device is shown. The image sensor device of FIG. 4 is similar to the image sensor device of FIG. 3, so duplicate description may be omitted.

Compared to the first embodiment of FIG. 3, a fourth insulating layer 148 is now formed on the second and third insulating layers 142 and 143, respectively. The fourth insulating layer may comprise the same material as the second insulating layer 142, such as SiN.

The anti-reflection layer structure 146 and 147 includes a third anti-reflection layer structure 146 and a fourth anti-reflection layer structure 147. The third anti-reflection layer structure includes the first insulating layer 141, the second insulating layer 142, and the fourth insulating layer 148. The fourth anti-reflection layer structure 147 includes the first insulating layer 141, the second insulating layer 142, the third insulating layer 143 and the fourth insulating layer 148. The fourth insulating layer 148 protects the third insulating layer 143.

For example, the third anti-reflection layer structure 146 may include the first insulating layer 141 of SiO2 having a thickness of 15 nm, the second insulating layer 142 of SiN having a thickness of 3.5 nm, and the fourth insulating layer 148 of SiN having a thickness of 3.5 nm. The third anti-reflection layer structure transmits a short wavelength blue light of about 400 to about 500 nm by Snell's law. The fourth anti-reflection layer structure 147 may include the first insulating layer 141 of SiO2 having a thickness of 15 nm, the second insulating layer 142 of SiN having a thickness of 3.5 nm, the third insulating layer 143 of a heat-treated SiON having a thickness of 15 nm, and the fourth insulating layer 148 of SiN having a thickness of 3.5 nm. The fourth anti-reflection layer structure transmits a long wavelength red/green light of about 500 to about 700 nm by Snell's law.

Figure 5:
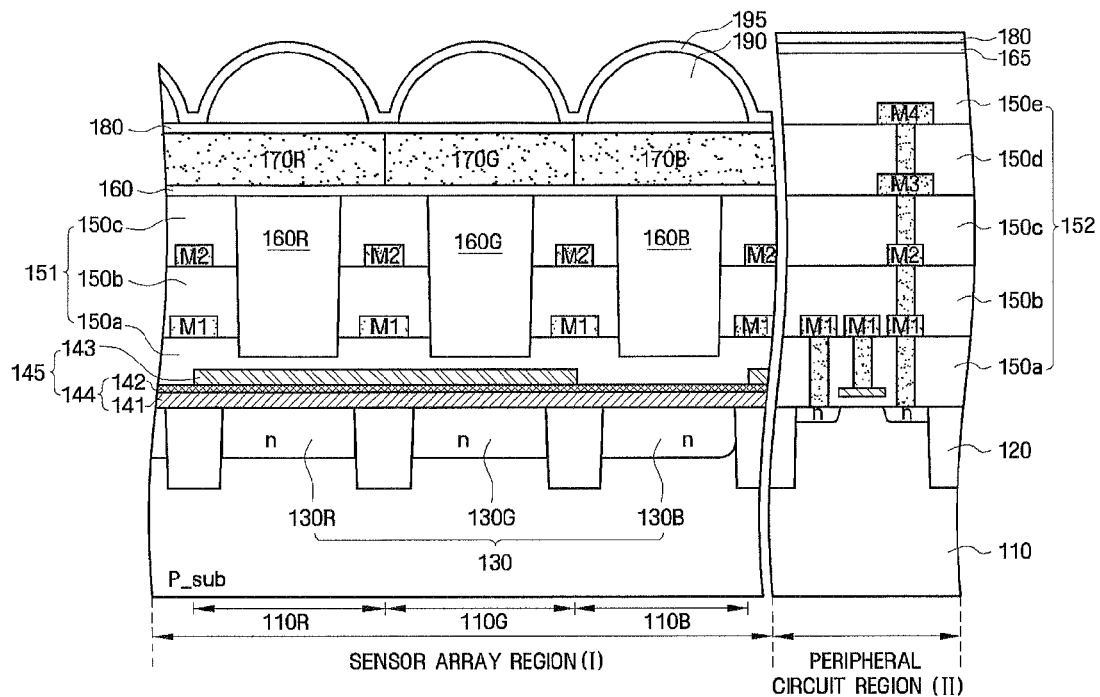
FIG. 5 is a schematic structural diagram of a third exemplary embodiment sensor device in accordance with an exemplary embodiment of the present disclosure.

Turning to FIG. 5, a third embodiment image sensor device is shown. The image sensor device of FIG. 5 is similar to the image sensor device of FIG. 3, so duplicate description may be omitted.

The third embodiment includes an active pixel sensor (APS) in the sensor array region. Compared to the first embodiment of FIG. 3, a top surface of a first interlayer dielectric layer structure 151 in the sensor array region I is lower than that of a second interlayer dielectric layer structure 152 in the peripheral circuit region II. This lower top surface further contributes to increased light sensitivity. The fourth insulating layer 148 of the second embodiment of FIG. 4 is similarly applicable to this embodiment.

A passivation layer, such as SiN, may be formed between the fifth interlayer dielectric layer 150e and the bottom planarization layer 165 in the peripheral circuit region II. The passivation layer may extend continuously toward a destination between the third interlayer dielectric layer 150c and the bottom planarization 165 in the sensor array region I. In the case of forming the passivation layer in the sensor array region I and the peripheral circuit region II, the passivation layer may be formed having a different height in the sensor array region I and the peripheral circuit region II due to this step.

A pad pattern may be formed to connect the fourth interconnection layer M4 through the upper planarization layer 180, the bottom planarization layer 165, the passivation layer, and the fifth interlayer dielectric layer 150e in the peripheral circuit region II.

Figure 6:
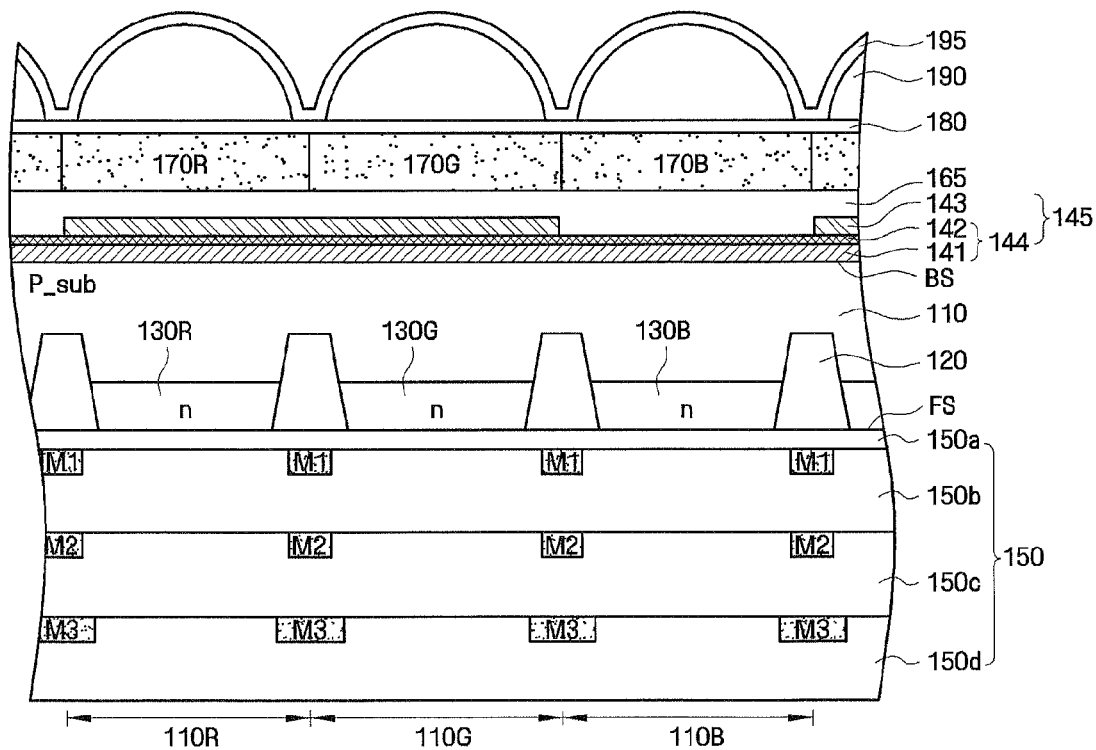
FIG. 6 is a schematic structural diagram of a fourth exemplary embodiment sensor device in accordance with an exemplary embodiment of the present disclosure.

Turning now to FIG. 6, a fourth embodiment image sensor device is shown. The image sensor device of FIG. 6 is similar to the image sensor device of FIG. 3, so duplicate description may be omitted.

Compared to the first embodiment of FIG. 3, this embodiment is configured so that a light enters into the backside of the substrate. This embodiment is a Backside Illuminated (BI) CIS.

Here, the photodiodes 130R, 130G, and 130B are formed in the substrate 110. The inter-layer dielectric layer structure 150 is formed on one surface or front side (FS) of the substrate 110, and includes a plurality of interlayer dielectric layers 150a, 150b, 150c, and 150d, and the interconnection layers M1, M2, and M3. The anti-reflection layer structure 144 and 145 is formed on the other surface or back side (BS) of the substrate 110. The fourth insulating layer 148 of the second embodiment of FIG. 4 is similarly applicable to this embodiment. A bottom planarization layer 165, the color filters 170R, 170G, and 170B, an upper planarization layer 180, a lens 190, and a protection layer 195 are sequentially formed on the anti-reflection layer structure 144 and 145.

Figure 7:
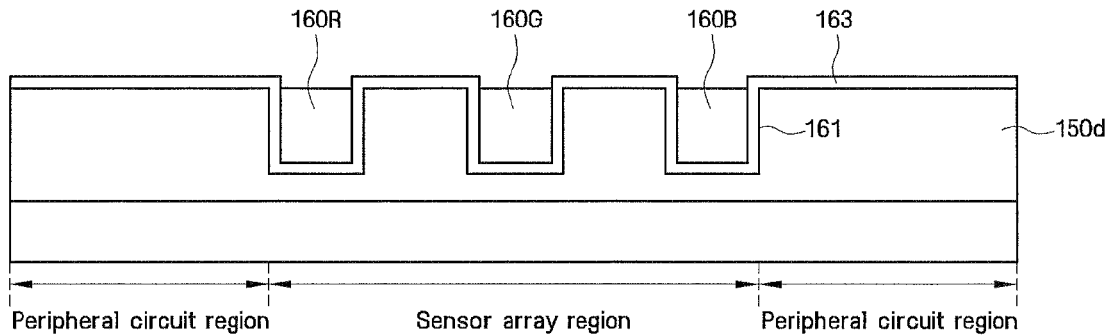
FIG. 7 is a schematic structural diagram of another exemplary embodiment sensor device in accordance with an exemplary embodiment of the present disclosure.

As shown in FIG. 7, an alternate embodiment image sensor device is shown. The image sensor device of FIG. 7 is similar to any of the image sensor devices of FIGS. 3 through 5, respectively, so duplicate description may be omitted.

This alternate embodiment incorporates features optionally applicable to the other embodiments. Here, a liner 163 may be further formed between a trench 161 and the light transmission part 160R, 160G, and/or 160B. The liner 163 may extend onto the surface of the fourth interlayer dielectric layer 150d along the sidewalls and bottom surface of the trench 161, and further extend toward the peripheral circuit region. In the case of a structure having a step such as the third embodiment of FIG. 5, the liner 163 has a step adjacent to an interface between the sensor array region and the peripheral circuit region. For example, the liner 163 may include SiN, SiON, Al2O3, TiO2, or a combination thereof. Moreover, the liner acts as a light guide for directing sloped or inclined light towards a photo sensor to further increase light sensitivity.

Figure 8:
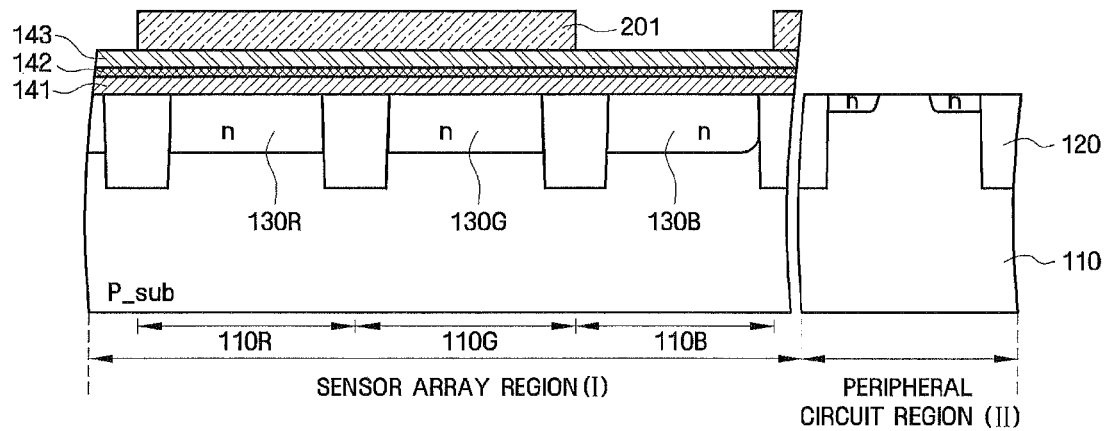
FIG. 8 is a schematic structural diagram of the first exemplary embodiment sensor device at a fabrication step in accordance with an exemplary embodiment of the present disclosure.

Turning to FIG. 8, the first exemplary embodiment image sensor device of FIG. 3 is shown at an intermediate step of fabrication. Thus, the image sensor device of FIG. 8 is similar to the image sensor device of FIG. 3, and duplicate description may be omitted.

Here, the unit pixels 110R, 110G, and 110B are defined by a device isolation region 120 in the sensor array region I of the substrate 110. The photodiodes 130R, 130G, and 130B are formed in the sensor array region I, and a plurality of MOS transistors, such as charge transfer transistors and the like, are formed in the sensor array region I and the peripheral circuit region II.

The first through third insulating layers 141, 142, and 143, respectively, are sequentially formed on the substrate 110. A mask pattern 201 is formed on the third insulating layer 143 exposing a part of the third insulating layer 143 on the blue photoelectric conversion device 130B.

Figure 9:
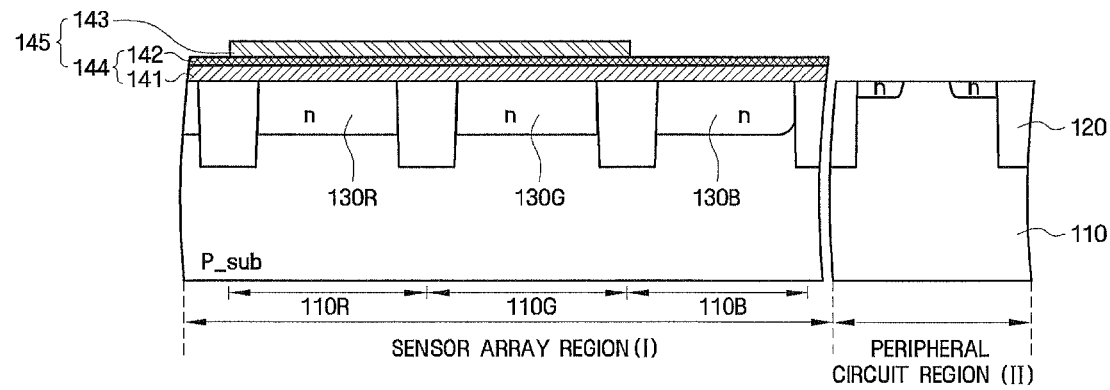
FIG. 9 is a schematic structural diagram of the first exemplary embodiment sensor device at another fabrication step in accordance with an exemplary embodiment of the present disclosure.

Turning now to FIG. 9, the first exemplary embodiment image sensor device of FIG. 3 is shown at an intermediate step of fabrication subsequent to that of FIG. 8. Thus, the image sensor device of FIG. 9 is similar to the image sensor device of FIGS. 3 and 8, and duplicate description may be omitted.

Here, the third insulating layer 143 is etched until exposing a top surface of the second insulating layer 142 using the mask pattern 201 by a wet etch, or alternatively a dry etch method. In the case of using the SiON as the third insulating layer 143, a heat treatment is used to increase a refractive index of the SiON using Rapid Thermal Anneal (RTA) or anneal step at a temperature of about 500 to about 1100° C.

Here, the heat treatment is applied after patterning the SiON. Alternately, the heat treatment may be applied before selectively removing the SiON, for example. In the case of TiO2 as the third insulating layer 143, the heat treatment may be omitted. The interlayer dielectric layer structure 150, the bottom planarization layer 165, the color filters 170R, 170G, and 170B, the upper planarization layer 180, the lens 190, and the protection layer 195 are sequentially formed on the anti-reflection layer structure 144 and 145.

Figure 10:
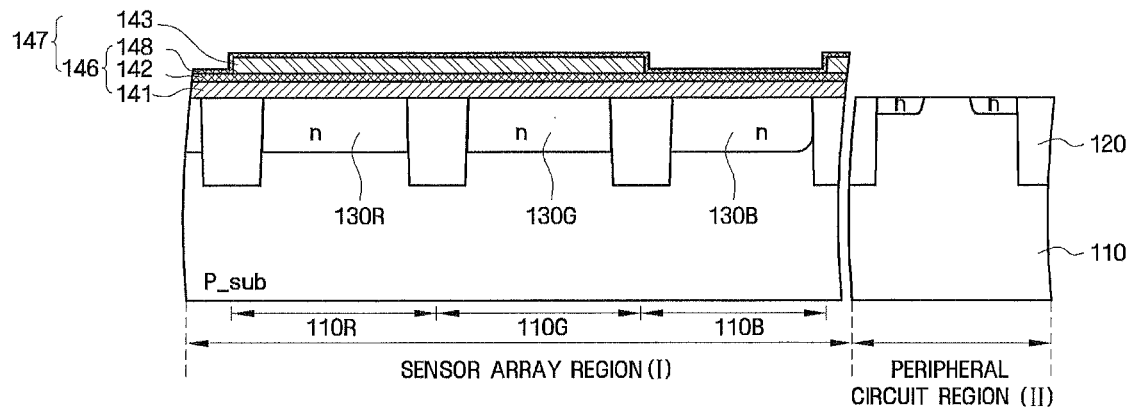
FIG. 10 is a schematic structural diagram of the second exemplary embodiment sensor device at a fabrication step in accordance with an exemplary embodiment of the present disclosure.

As shown in FIG. 10, the second exemplary embodiment image sensor device of FIG. 4 is shown at an intermediate step of fabrication. Thus, the image sensor device of FIG. 10 is similar to the image sensor device of FIG. 4. Moreover, the image sensor device of FIG. 10 is comparable to the image sensor device of FIG. 8, so duplicate description may be omitted.

Here, as compared to the embodiment of FIG. 8 after the optional heat treatment of FIG. 9, the fourth insulating layer 148 is formed on the second insulating layer 142 and the third insulating layer 143. The fourth insulating layer is the same material as the second insulating layer, but it may be different in alternate embodiments. For example, the fourth insulating layer may be formed by chemical vapor deposition (CVD) of SiN, diffusion of SiN, or plasma enhancement (PE) CVD of SiN to obtain different ratios of compound densities.

The heat treatment may be applied after forming the fourth insulating layer 148. In addition, the interlayer dielectric layer structure 150, the bottom planarization layer 165, the color filters 170R, 170G, and 170B, the upper planarization layer 180, the lens 190, and the protection layer 195 are sequentially formed on the anti-reflection layer structure 146 and 147.

Figure 11:
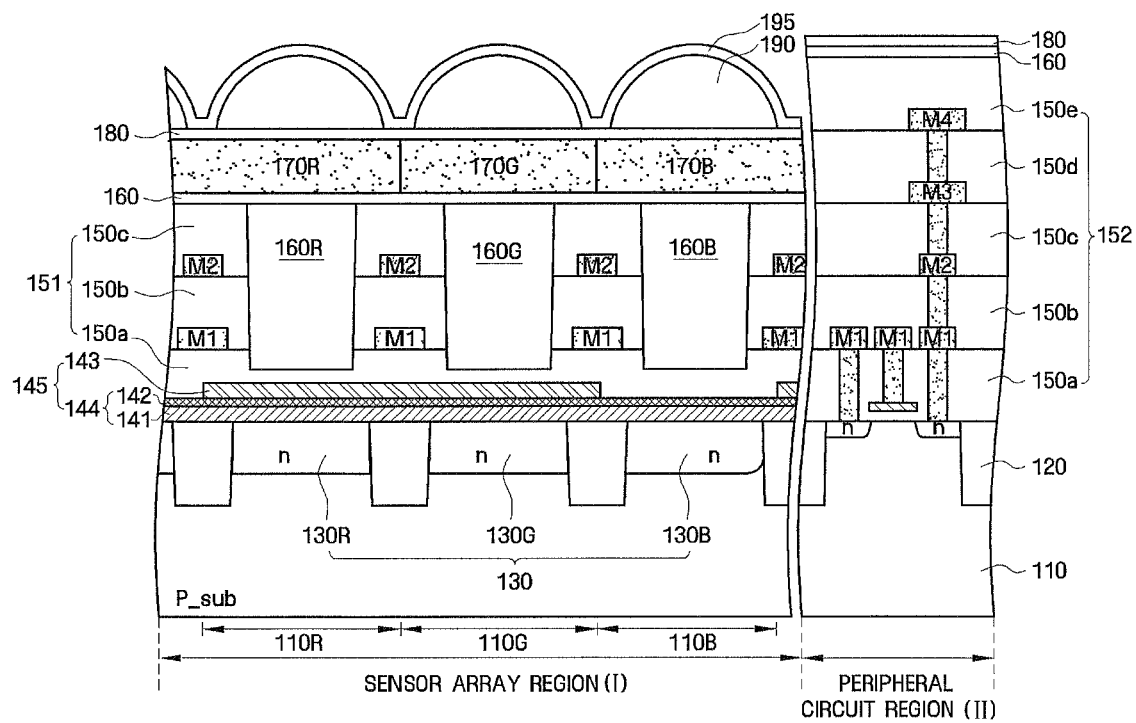
FIG. 11 is a schematic structural diagram of the third exemplary embodiment sensor device at a fabrication step in accordance with an exemplary embodiment of the present disclosure.

Turning to FIG. 11, the third exemplary embodiment image sensor device of FIG. 5 is shown at an intermediate step of fabrication. Thus, the image sensor device of FIG. 11 is similar to the image sensor device of FIG. 5, so duplicate description may be omitted.

Here, after forming the fifth interlayer dielectric layer 150e throughout the sensor array region I and the peripheral circuit region II, the passivation layer is formed. The passivation layer and the fourth and fifth interlayer dielectric layers 150d and 150e, respectively, of the sensor array region I are selectively removed. This leaves the passivation layer and the fourth and fifth interlayer dielectric layers 150d and 50e of the peripheral circuit region II.

Referring back to FIG. 5, after forming the light transmission parts 160R, 160G, and 160B in the sensor array region I, the bottom planarization layer 165 is formed throughout the substrate 110 including the sensor array region I and the peripheral circuit region II. The remaining steps are comparable to those of FIGS. 8 and 10.

Before forming the bottom planarization layer 165, an additional passivation layer may be formed throughout the sensor array region and the peripheral circuit region. Alternatively, the passivation layer may be formed throughout the sensor array region and the peripheral circuit region after forming the fifth interlayer dielectric layer 150e, the difference step, and the light transmission parts 160R, 160G, and 160B, and before forming the bottom planarization layer 165.

Figure 12:
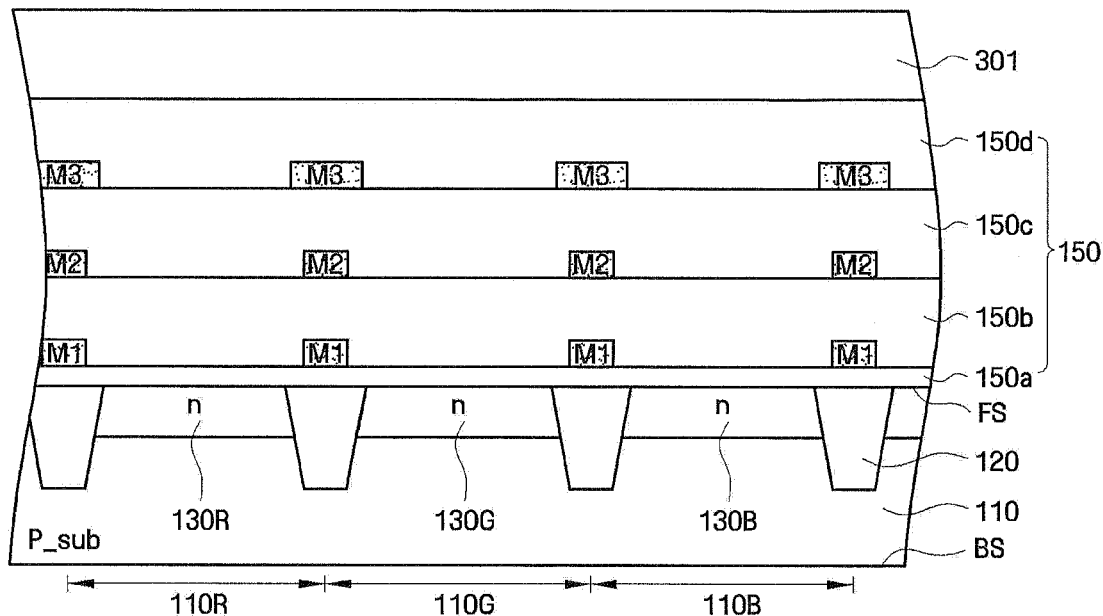
FIG. 12 is a schematic structural diagram of the fourth exemplary embodiment sensor device at a fabrication step in accordance with an exemplary embodiment of the present disclosure.

Turning now to FIG. 12, the fourth exemplary embodiment image sensor device of FIG. 6 is shown at an intermediate step of fabrication. Thus, the image sensor device of FIG. 12 is similar to the image sensor device of FIG. 6, so duplicate description may be omitted.

Here, the unit pixels 110R, 110G, and 110B are defined by the device isolation region 120. Each photodiode 130R, 130G, and 130B is formed in each unit pixel 110R, 110G, and 110B, respectively. The interlayer dielectric layer structure 150 is formed on one surface or front side (FS) of the substrate 110. A support substrate 301 is attached on the interlayer dielectric layer structure 150 of the substrate 110 to support the substrate 110.

Figure 13:
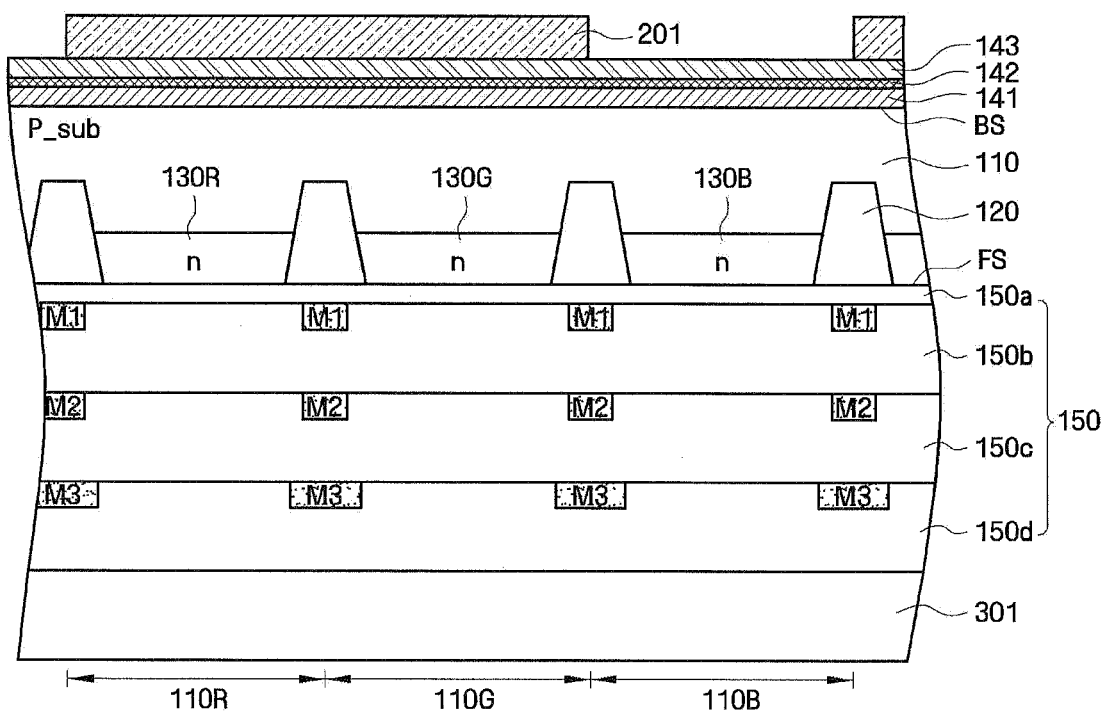
FIG. 13 is a schematic structural diagram of the fourth exemplary embodiment sensor device at another fabrication step in accordance with an exemplary embodiment of the present disclosure.

As shown in FIG. 13, the fourth exemplary embodiment image sensor device of FIG. 6 is shown at an intermediate step of fabrication subsequent to that of FIG. 12. Thus, the image sensor device of FIG. 13 is similar to the image sensor device of FIGS. 6 and 12, so duplicate description may be omitted.

Here, the substrate 110 is turned upside down to position the other surface or back side (BS) of the substrate 110 upward. The other surface or BS of the substrate 110 may be partially removed using a reactive ion etch, Chemical Mechanical Polishing (CMP), Back Grinding (BGR), or the like to increase light sensitivity.

The first through third insulating layers 141, 142, and 143 for the anti-reflection layer structure 144 and 145 are formed on the other surface or BS of the substrate 110. The etch mask pattern 201 exposes the third insulating layer 143 on the blue unit pixel 110B.

Figure 14:
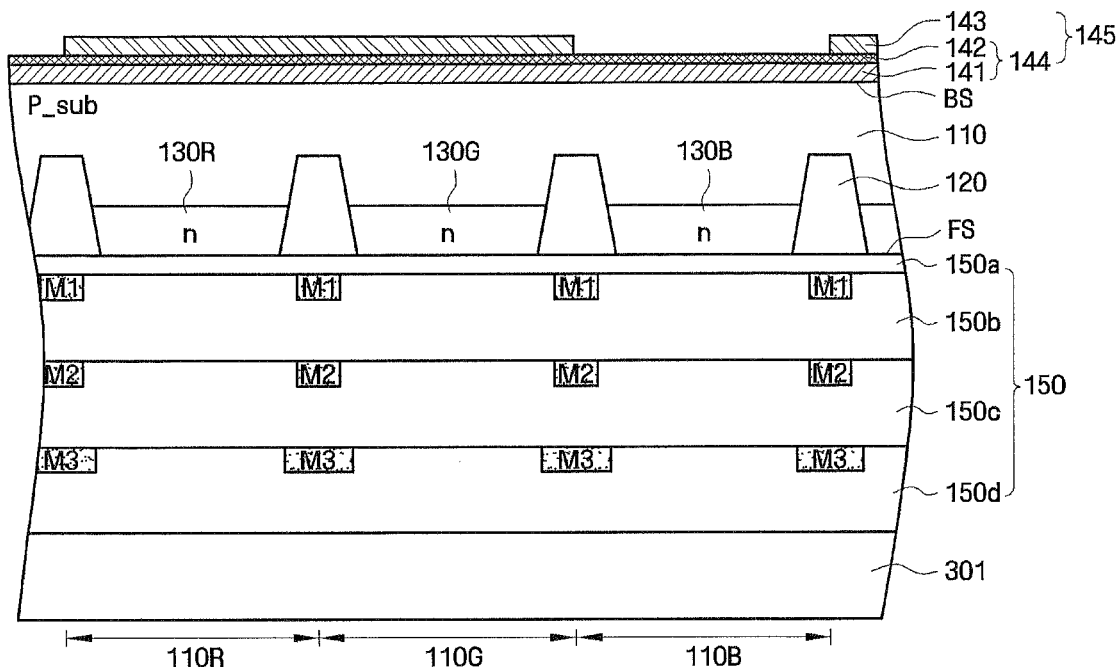
FIG. 14 is a schematic structural diagram of the fourth exemplary embodiment sensor device at another fabrication step in accordance with an exemplary embodiment of the present disclosure.

Turning to FIG. 14, the fourth exemplary embodiment image sensor device of FIG. 6 is shown at an intermediate step of fabrication subsequent to that of FIGS. 12 and 13. Thus, the image sensor device of FIG. 14 is similar to the image sensor device of FIGS. 6, 12 and 13, so duplicate description may be omitted.

Here, the third insulating layer 143 is patterned until exposing the top surface of the second insulating layer 142 using the etch mask pattern 201 as an etch mask. In the case of SiON as the third insulating layer 143, the heat treatment step is applied. This step may be done before selectively removing the SiON. Optionally, the fourth insulating layer 148 of FIG. 4 may additionally be formed.

Referring back to FIG. 6, the bottom planarization layer 165, the color filters 170R, 170G, and 170B, the upper planarization layer 180, the lens 190, and the protection layer 195 are sequentially formed on the other surface or BS of the substrate 110 including the anti-reflection layer structure 144 and 145.

Figure 15:
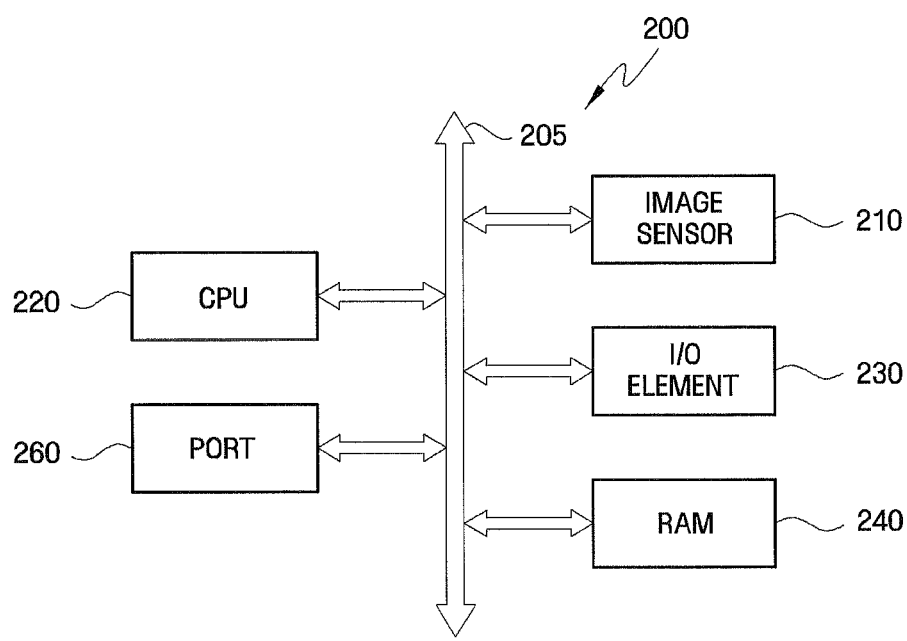
FIG. 15 is a schematic block diagram of an exemplary embodiment image sensing system in accordance with an exemplary embodiment of the present disclosure.

Turning now to FIG. 15, an exemplary embodiment image sensing system is indicated generally by the reference numeral 300. The system 300 includes a communications bus 305, an image sensor 310 in signal communication with the bus, a processor or CPU 320 in signal communication with the bus, an input/output (I/O) element 330 in signal communication with the bus, a random access memory (RAM) 340 in signal communication with the bus, and a port 360 in signal communication with the bus.

The port 360 may couple a video card, sound card, memory card and/or USB device or the like, and may also communicate with other apparatus by data transfer. The image sensor 310 may optionally be integrated with the CPU, a digital signal processing (DSP) apparatus, a microprocessor and/or memory or the like.

Figure 16:
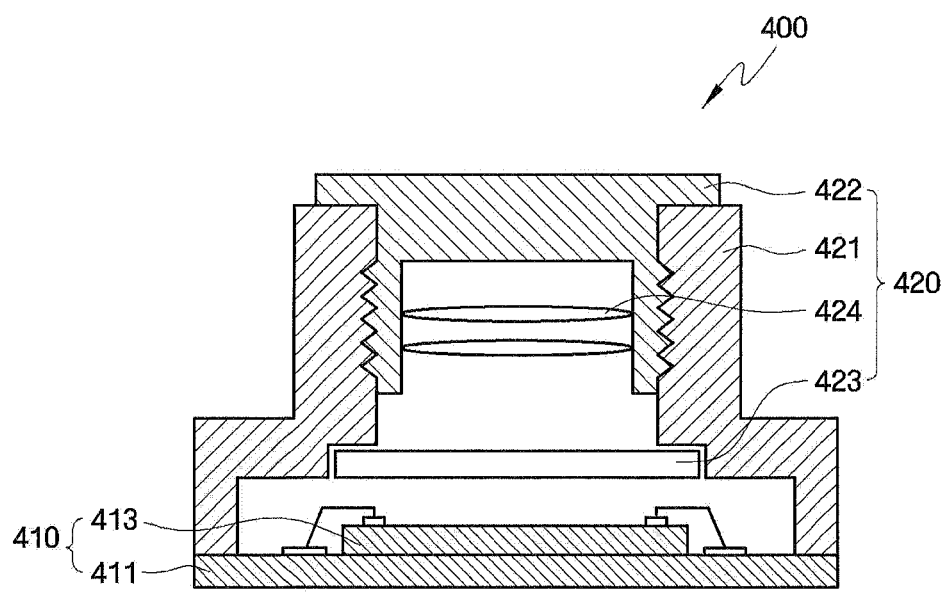
FIG. 16 is a schematic structural diagram of an exemplary embodiment image sensing apparatus in accordance with an exemplary embodiment of the present disclosure.

As shown in FIG. 16, an exemplary embodiment image sensing or camera apparatus is indicated generally by the reference numeral 400. The apparatus 400 includes a CIS package 410 having an image sensor 413 formed on the circuit substrate 411 through bonding wire. A housing 420 is attached on the substrate 411 to protect the substrate 411 and the image sensor 413. The housing 420 includes a cylinder part 421 through which an image passes, a protection cover 422, a filter 423 for blocking infrared light and reflections, and a lens 424.

Figure 17:
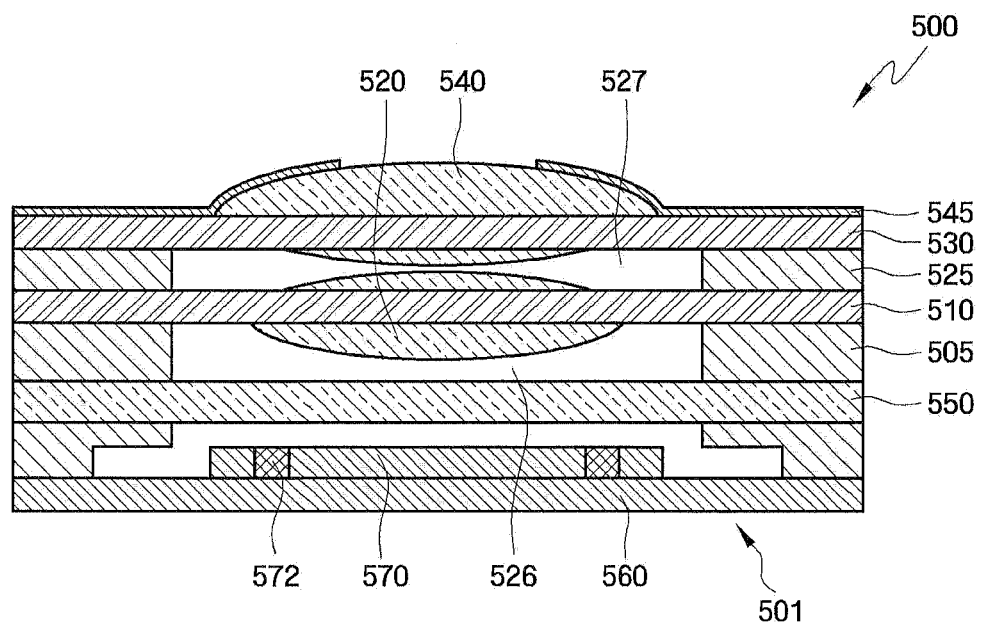
FIG. 17 is a schematic structural diagram of another exemplary embodiment image sensing apparatus in accordance with an exemplary embodiment of the present disclosure.

Turning to FIG. 17, another exemplary embodiment image sensing or camera apparatus is indicated generally by the reference numeral 500. The apparatus 500 includes an image sensor package 501, a first lens 520, support members 505 and 525, lens components 526 and 527, a transparent substrate 510 and 530, a second lens 540, an aperture 545, a glass 550, a PCB substrate 560, an image sensor chip 570, and a through via electrode 572. Compared to the camera apparatus 400 of FIG. 16, the camera apparatus 500 includes the CIS package 501 having a PCB substrate 560 connected to the image sensor chip 570 through the via electrode 572.

Figure 18:
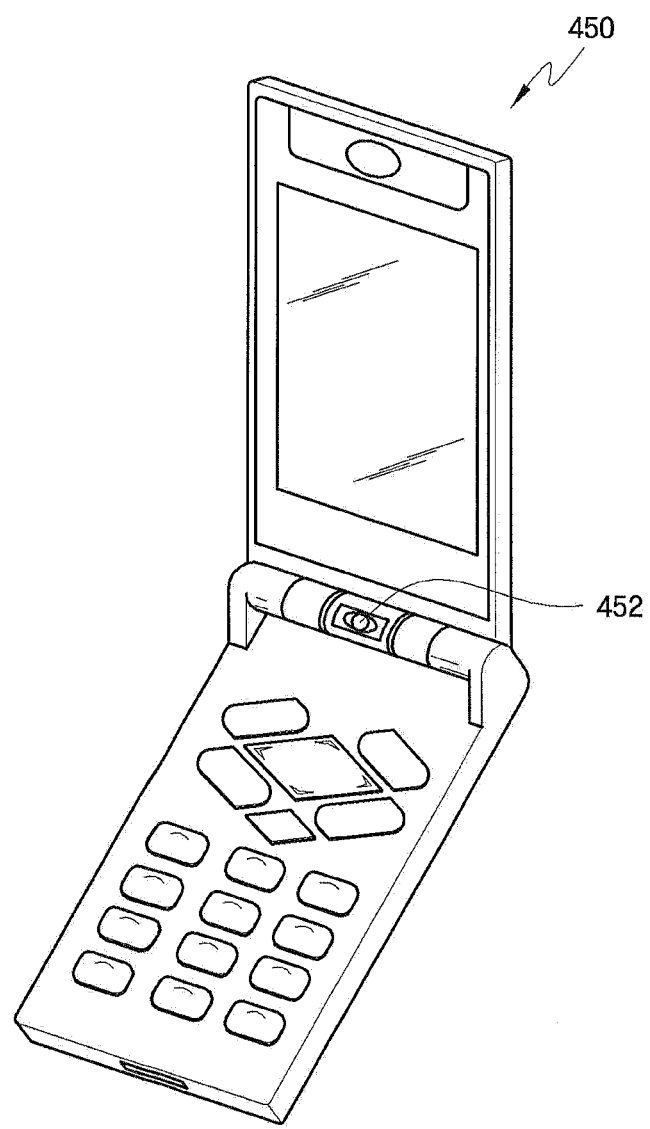
FIG. 18 is a schematic diagram of an exemplary embodiment cellular telephone having an image sensing system in accordance with an exemplary embodiment of the present disclosure.

Turning now to FIG. 18, an exemplary embodiment cellular telephone is indicated generally by the reference numeral 450. The cellular telephone 450 includes an image sensing system 452 having an anti-reflection layer structure in accordance with an exemplary embodiment of the present disclosure. Thus, the cellular telephone 450 exhibits an improvement in light sensitivity.

Several exemplary embodiments have been provided, with alternate features introduced where such introduction should not cause confusion. Other alternate embodiments and features are also contemplated, but were omitted for clarity. For example, the SiO2, SiN, and/or SiON may be formed on only the red regions in some alternate embodiments, or on only the green regions in other alternate embodiments. Moreover, the RGB color model may be replaced with other models, such as the derived HSV model. For example, rather than using red, green and blue color sensing pixels, alternate embodiments may use magenta, yellow and cyan color sensing pixels, or the like.

It is to be understood that the foregoing is illustrative of the inventive concept and is not to be construed as limited to the specific embodiments disclosed, and that modifications to the disclosed exemplary embodiments, as well as other embodiments, are intended to be included within the scope of the appended claims. In the claims, any means-plus-function clauses are intended to cover the structures described herein as performing the recited function, and not only structural equivalents, but also equivalent structures.

These and other features of the present disclosure may be readily ascertained by one of ordinary skill in the pertinent art based on the teachings herein. Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:
1. An anti-reflective image sensor comprising:
a substrate;
a plurality of first color sensing pixels disposed in the substrate;
a plurality of second color sensing pixels disposed in the substrate;
a plurality of third color sensing pixels disposed in the substrate;
a first layer disposed directly on the pluralities of first, second and third color sensing pixels;

a second layer disposed directly on the first layer overlying the pluralities of first, second and third color sensing pixels; and a third layer disposed directly on portions of the second layer overlying at least one of the pluralities of first or second color sensing pixels, wherein the first layer has a first refractive index, the second layer has a second refractive index greater than the first refractive index, and the third layer has a third refractive index greater than the second refractive index.

2. The anti-reflective image sensor of claim 1 wherein the first color is red, the second color is green, and the third color is blue.

3. The anti-reflective image sensor of claim 1 wherein the first color is magenta, the second color is yellow, and the third color is cyan.

4. The anti-reflective image sensor of claim 1 wherein the first layer comprises $SiO_2$, the second layer comprises $Si_3N_4$, and the third layer comprises $TiO_2$ or heat-treated SiON.

5. The anti-reflective image sensor of claim 1 wherein the first layer has a refractive index between about 1.45 and about 1.50, and the second layer has a refractive index between about 1.95 and about 2.05.

6. The anti-reflective image sensor of claim 1 wherein the first layer has a thickness of about 15 nm, the second layer has a thickness of about 7 nm, and the third layer has a thickness of about 15 nm.

7. The anti-reflective image sensor of claim 1 wherein the first layer is a gate dielectric layer or an insulating layer.

8. The anti-reflective image sensor of claim 1, further comprising a fourth layer disposed on the exposed second and third layers, comprising the same material as the second layer.

9. The anti-reflective image sensor of claim 1, further comprising:
a first inter-layer dielectric region disposed on the second and third layers in a sensor array region; and
a second inter-layer dielectric region disposed in a peripheral circuit region, wherein a top of the first inter-layer dielectric region is lower than a top of the second inter-layer dielectric region.

10. The anti-reflective image sensor of claim 1, further comprising:
a first inter-layer dielectric region disposed under the first layer in a sensor array region; and
at least one micro-lens disposed above the first layer for backside illumination.

11. The anti-reflective image sensor of claim 1 wherein the third layer is disposed on all of the first or second color pixels, and disposed on some of the second or first color pixels, respectively.

12. An anti-reflective image sensor comprising:
a substrate;
a first color sensing pixel disposed in the substrate;
a first layer disposed directly on the first color sensing pixel;
a second layer disposed directly on the first layer overlying the first color sensing pixel; and
a third layer disposed directly on the second layer overlying the first color sensing pixel,
wherein the first layer has a first refractive index, the second layer has a second refractive index greater than the first refractive index, and the third layer has a third refractive index greater than the second refractive index.

13. The anti-reflective image sensor of claim 12 wherein the first color is red.

14. The anti-reflective image sensor of claim 12 wherein the first layer is $SiO_2$, the second layer is SiN, and the third layer is heat-treated SiON.

15. The anti-reflective image sensor of claim 12, further comprising:
a second color sensing pixel disposed in the substrate;
a third color sensing pixel disposed in the substrate;
a first layer disposed directly on the first, second and third color sensing pixels;
a second layer disposed directly on the first layer overlying the first, second and third color sensing pixels; and
a third layer disposed directly on portions of the second layer overlying at least one of the first or second color sensing pixels.

16. The anti-reflective image sensor of claim 15, wherein the first color is red, the second color is green, and the third color is blue.

17. The anti-reflective image sensor of claim 15 wherein the first color is magenta, the second color is yellow, and the third color is cyan.

18. The anti-reflective image sensor of claim 15 wherein the first layer comprises $SiO_2$, the second layer comprises $Si_3N_4$, and the third layer comprises heat-treated SiON.

19. The anti-reflective image sensor of claim 15 wherein the first layer has a refractive index between about 1.45 and about 1.50, and the second layer has a refractive index between about 1.95 and about 2.05.

20. The anti-reflective image sensor of claim 15 wherein the first layer has a thickness of about 15 nm, the second layer has a thickness of about 7 nm, and the third layer has a thickness of about 15 nm.

21. The anti-reflective image sensor of claim 15 wherein the first layer is a gate dielectric layer or an insulating layer.

22. The anti-reflective image sensor of claim 15, further comprising a fourth layer disposed on the exposed second and third layers, comprising the same material as the second layer.

23. The anti-reflective image sensor of claim 15, further comprising:
a first inter-layer dielectric region disposed on the second and third layers in a sensor array region; and
a second inter-layer dielectric region disposed in a peripheral circuit region, wherein a top of the first inter-layer dielectric region is lower than a top of the second inter-layer dielectric region.

24. An anti-reflective image sensor comprising:
a substrate;
a first color sensing pixel disposed in a front side of the substrate;
a first layer disposed directly on a backside of the substrate and overlapping the first color sensing pixel;
a second layer disposed directly above the first layer overlying the first color sensing pixel;
a third layer disposed directly above the second layer overlying the first color sensing pixel,
a first inter-layer dielectric structure disposed on the front side of the substrate under the first layer and underneath the first color sensing pixel in a sensor array region, wherein the first inter-layer dielectric structure includes an interlayer dielectric layer and an interconnection layer; and
at least one micro-lens disposed above the first layer, the second layer and the third layer for backside illumination,
wherein the first layer has a first refractive index, the second layer has a second refractive index greater than the first refractive index, and the third layer has a third refractive index greater than the second refractive index.

25. The anti-reflective image sensor of claim 15 wherein the third layer is disposed on all of the first or second color pixels, and disposed on some of the second or first color pixels, respectively.

* * * * *